(12) United States Patent
Fu et al.

(10) Patent No.: US 11,126,816 B2
(45) Date of Patent: Sep. 21, 2021

(54) DISPLAY DEVICE AND OPERATION METHOD THEREOF

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Jianbo Fu, Beijing (CN); Hailong Wu, Beijing (CN); Yi Dan, Beijing (CN); Xing Dong, Beijing (CN); Yanlin Han, Beijing (CN); Jiandong Guo, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 42 days.

(21) Appl. No.: 16/642,068

(22) PCT Filed: Jan. 29, 2019

(86) PCT No.: PCT/CN2019/073709
§ 371 (c)(1),
(2) Date: Feb. 26, 2020

(87) PCT Pub. No.: WO2020/154895
PCT Pub. Date: Aug. 6, 2020

(65) Prior Publication Data
US 2021/0150174 A1 May 20, 2021

(51) Int. Cl.
*G06K 9/00* (2006.01)
*H01L 27/32* (2006.01)
*G06F 3/041* (2006.01)

(52) U.S. Cl.
CPC ......... *G06K 9/0002* (2013.01); *G06F 3/0412* (2013.01); *G06K 9/0004* (2013.01);
(Continued)

(58) Field of Classification Search
CPC ......... G06K 9/00006–0012; G06K 2009/0006
See application file for complete search history.

(56) References Cited

U.S. PATENT DOCUMENTS 9,672,405 B2 * 6/2017 Lin .................... G06K 9/00033
10,318,791 B2 * 6/2019 He ...................... G06K 9/0012
(Continued)

FOREIGN PATENT DOCUMENTS

| CN | 106815546 A | 6/2017 |
| CN | 107016383 A | 8/2017 |
| CN | 108345781 A | 7/2018 |

*Primary Examiner* — Patrick F Marinelli
(74) *Attorney, Agent, or Firm* — Dilworth & Barrese, LLP.; Michael J. Musella, Esq.

(57) ABSTRACT

A display device and an operation method thereof are disclosed. The display device includes a display panel, a pressure sensor, a skin texture sensor, and a controller. The skin texture sensor and the pressure sensor are respectively coupled to the controller; the pressure sensor is configured to detect a pressing action on a display side of the display panel; the skin texture sensor is configured to detect a skin texture image of a user touching the display side of the display panel; and the controller is configured to awaken the skin texture sensor when the pressure sensor detects the pressing action. The display device reduces power consumption of the fingerprint detection.

18 Claims, 8 Drawing Sheets

(52) U.S. Cl.
CPC .......... *G06K 9/0012* (2013.01); *H01L 27/323* (2013.01); *H01L 27/3234* (2013.01); *G06F 2203/04105* (2013.01)

(56) References Cited

U.S. PATENT DOCUMENTS

| | | | |
|---|---|---|---|
| 10,325,142 B2* | 6/2019 | He | G06K 9/0002 |
| 10,620,745 B2* | 4/2020 | He | G02F 1/13338 |
| 10,922,398 B2* | 2/2021 | He | H01L 27/3244 |
| 2015/0347812 A1* | 12/2015 | Lin | G06K 9/00033 382/124 |
| 2016/0314334 A1* | 10/2016 | He | G06K 9/0002 |
| 2017/0344155 A1 | 11/2017 | Lee et al. | |
| 2018/0046281 A1* | 2/2018 | Pi | G06K 9/00114 |
| 2019/0026527 A1* | 1/2019 | He | G06K 9/0004 |
| 2019/0034020 A1* | 1/2019 | He | G06K 9/00033 |
| 2019/0102598 A1* | 4/2019 | Jiang | G06K 9/0008 |
| 2019/0251317 A1* | 8/2019 | Jiang | G06F 21/81 |
| 2019/0303642 A1* | 10/2019 | He | G06K 9/0004 |
| 2019/0377858 A1* | 12/2019 | He | G06K 9/0002 |
| 2020/0050818 A1* | 2/2020 | He | G06K 9/00906 |
| 2020/0218392 A1* | 7/2020 | He | G02F 1/13338 |
| 2021/0097257 A1* | 4/2021 | Gupta | G06F 21/32 |

\* cited by examiner

DISPLAY DEVICE AND OPERATION METHOD THEREOF

TECHNICAL FIELD

Embodiments of the present disclosure relate to a display device and an operation method thereof.

BACKGROUND

Fingerprint recognition technology is widely used in the fields of security and smart attendance such as fingerprint punch-in. With the maturity and convenience of the technology, the technology is gradually applied to smart phones and has become a basic configuration of the smart phones. How to design and manufacture a more optimized structure of a display device is a focus issue in the art.

SUMMARY

At least an embodiment of the present disclosure provides a display device comprising a display panel, a pressure sensor, a skin texture sensor, and a controller, the skin texture sensor and the pressure sensor are respectively coupled to the controller; the pressure sensor is configured to detect a pressing action on a display side of the display panel; the skin texture sensor is configured to detect a skin texture image of a user touching the display side of the display panel; and the controller is configured to awaken the skin texture sensor when the pressure sensor detects the pressing action.

For example, the display device provided by an embodiment of the present disclosure further comprises a live detection sensor, the live detection sensor is coupled to the controller and configured to detect whether the pressing action is executed by a human body; and the controller is further configured to awaken the skin texture sensor in a case where the live detection sensor feeds back that the pressing action is executed by the human body, or else, turn off the skin texture sensor.

For example, in the display device provided by an embodiment of the present disclosure, the live detection sensor is a capacitance touch sensor or an infrared sensor.

For example, in the display device provided by an embodiment of the present disclosure, the pressure sensor is provided at at least one position selected from the group consisting of: a surface of the display side of the display panel, an interior of the display panel, and a surface of a back side, opposite to the display side, of the display panel.

For example, in the display device provided by an embodiment of the present disclosure, the pressure sensor is provided at the interior of the display panel, and the pressure sensor comprises a transistor and a pressure transmission portion; the transistor comprises a channel region; the pressure transmission portion is overlapped with the channel region and configured to transmit a pressure of the pressing action to the channel region; and a resistance of the channel region is variable under action of the pressure.

For example, in the display device provided by an embodiment of the present disclosure, the pressure sensor further comprises a resistance measuring circuit; the transistor is coupled to the resistance measuring circuit; and the resistance measuring circuit is configured to measure a variation of the resistance of the channel region of the transistor and send a feedback signal to the controller.

For example, in the display device provided by an embodiment of the present disclosure, the transistor comprises a gate electrode, a source electrode and a drain electrode; the gate electrode is closer to the pressure transmission portion compared with the source electrode and the drain electrode; or the source electrode and the drain electrode are closer to the pressure transmission portion compared with the gate electrode.

For example, in the display device provided by an embodiment of the present disclosure, the pressure transmission portion is cylindrical.

For example, in the display device provided by an embodiment of the present disclosure, the pressure sensor is on the surface of the display side of the display panel, the pressure sensor comprises a first electrode, a piezoelectric material layer and a second electrode, and the first electrode, the piezoelectric material layer and the second electrode are sequentially stacked on the surface of the display side of the display panel.

For example, in the display device provided by an embodiment of the present disclosure, the pressure sensor further comprises a voltage measuring circuit, the voltage measuring circuit is configured to be electrically connected with the first electrode and the second electrode, and the voltage measuring circuit is configured to measure a voltage difference produced between two sides of the piezoelectric material layer when the pressure sensor is under action of the pressing action, and send a feedback signal to the controller.

For example, in the display device provided by an embodiment of the present disclosure, the piezoelectric material layer is a transparent piezoelectric film.

For example, in the display device provided by an embodiment of the present disclosure, the controller is further configured to control a circuit of the live detection sensor to be turned off and to control a circuit of the skin texture sensor to be turned off after the skin texture image of the user is successfully recognized.

For example, in the display device provided by an embodiment of the present disclosure, the display panel comprises a pixel unit; the pixel unit comprises a light-emitting element; and a light emitted by the light-emitting element during work is reflected by a skin, on the display side of the display panel, of the user, and is used for recognizing the skin texture image of the user.

For example, in the display device provided by an embodiment of the present disclosure, the display panel is an organic light-emitting diode display panel or a quantum dot light-emitting diode display panel.

For example, in the display device provided by an embodiment of the present disclosure, the display panel comprises an array substrate and an opposing substrate; the transistor is formed on the array substrate; and the pressure transmission portion is clamped between the opposing substrate and the transistor.

At least an embodiment of the present disclosure further provides an operation method of a display device, comprising: allowing the pressure sensor to detect the pressing action on the display side of the display panel; allowing the controller to awaken the skin texture sensor when the pressure sensor detects the pressing action on the display side of the display panel; and allowing the skin texture sensor to detect the skin texture image of the user touching the display side of the display panel.

For example, in the operation method of the display device provided by an embodiment of the present disclosure, the display device further comprises a live detection sensor, and the method further comprises: allowing the live detection sensor to detect whether the pressing action is executed by a human body; and the allowing the skin texture sensor to detect the skin texture image of the user touching the display side of the display panel comprises: allowing the controller to awaken the skin texture sensor in a case where the live detection sensor feeds back that the pressing action is executed by the human body, or else, allowing the controller to turn off the skin texture sensor.

For example, the operation method of the display device provided by an embodiment of the present disclosure further comprises: after the skin texture image of the user is successfully recognized, allowing the controller to control a circuit of the live detection sensor to be turned off and to control a circuit of the skin texture sensor to be turned off.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
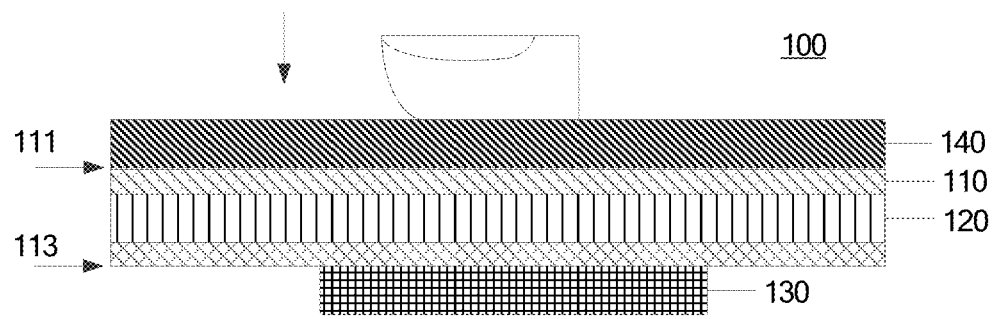
FIG. 1A is a schematic cross-sectional view of a display device provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

An under-screen fingerprint detection module of a display device is always in a working state when the display device is in a screen-off state. Such the operation mode consumes a lot of power and easily causes a misoperation, which may cause an electronic device including the display device to be awakened by mistake.

An under-screen fingerprint unlocking solution is to provide an additional pressure detection sensor under the display device, but the under-screen fingerprint unlocking solution is costly and occupies the internal space of the display device, and in a case where the pressure on the display device is not a pressure from a finger, the pressure detection sensor may still trigger the under-screen fingerprint unlocking function, resulting in unnecessary power consumption and being prone to produce a misoperation.

At least one embodiment of the present disclosure provides a display device, and the display device includes a display panel, a pressure sensor, a skin texture sensor and a controller. The skin texture sensor and the pressure sensor are respectively coupled to the controller. The pressure sensor is configured to detect a pressing action on a display side of the display panel. The skin texture sensor is configured to detect a skin texture image of a user touching the display side of the display panel. The controller is configured to awaken the skin texture sensor when the pressure sensor detects the pressing action.

In the display device provided by at least one embodiment of the present disclosure, the pressure sensor is adopted to detect the pressing action on the display side of the display panel. In a case where it is determined that the pressure sensor detects the pressing action, the controller awakens the skin texture sensor to cause the skin texture sensor to detect the skin texture image of the user touching the display side of the display panel, thereby reducing the power consumption of under-screen fingerprint detection.

Detailed description will be given below to some embodiments of the present disclosure with reference to the accompanying drawings. It should be noted that same or similar reference numbers in different accompanying drawings are used for indicating same described elements.

Figure 1B:
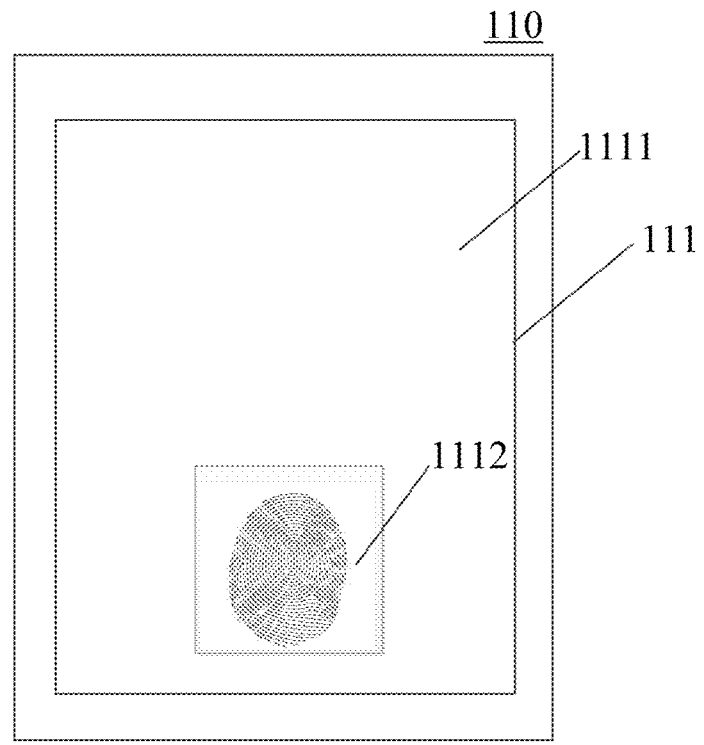
FIG. 1B is a schematic plan view of the display panel provided by the embodiment as shown in FIG. 1A.
Figure 1C:
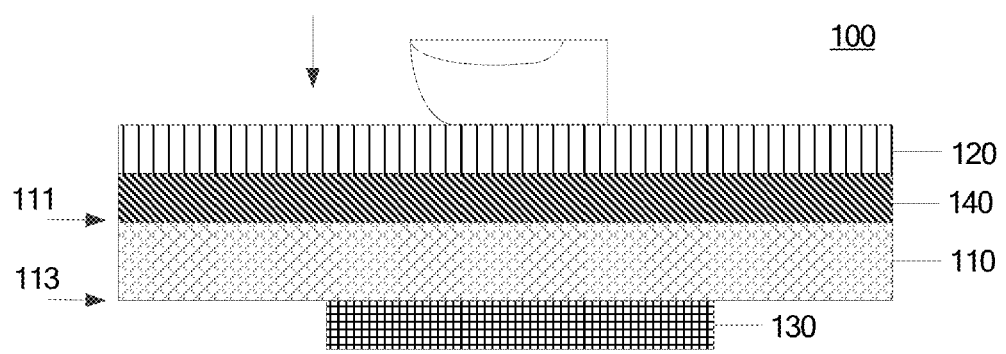
FIG. 1C is a schematic cross-sectional view of another display device provided by some embodiments of the present disclosure.
Figure 1D:
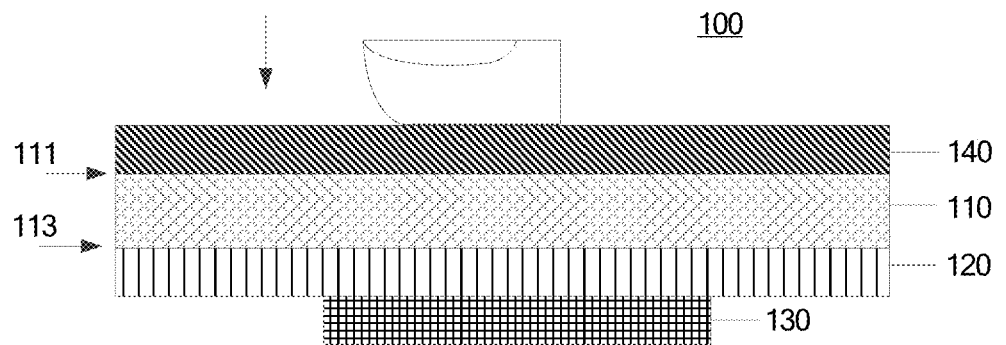
FIG. 1D is a schematic cross-sectional view of still another display device provided by some embodiments of the present disclosure.
Figure 1E:
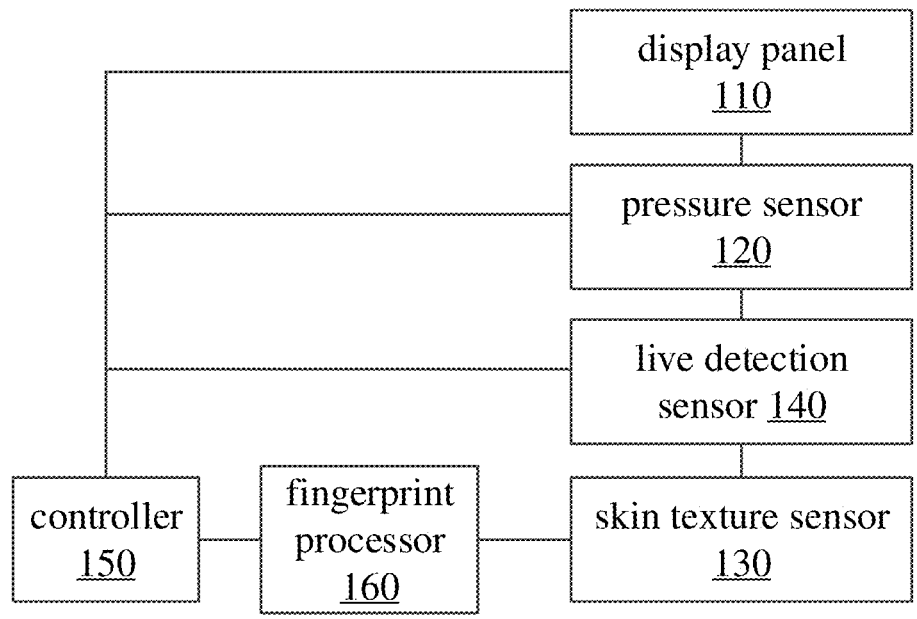
FIG. 1E is a block diagram of a display device provided by some embodiments of the present disclosure.

FIG. 1A is a schematic cross-sectional view of a display device 100 provided by some embodiments of the present disclosure. FIG. 1B is a schematic plan view of the display panel 110 provided by the embodiment as shown in FIG. 1A. FIG. 1C is a schematic cross-sectional view of another display device 100 provided by some embodiments of the present disclosure. FIG. 1D is a schematic cross-sectional view of still another display device 100 provided by some embodiments of the present disclosure. FIG. 1E is a block diagram of a display device provided by some embodiments of the present disclosure.

As shown in FIGS. 1A, 1B and 1E, the display device 100 includes a display panel 110, a pressure sensor 120, a skin texture sensor 130 and a controller 150. A user can view the content displayed by the display panel 110 on a display side 111 of the display panel 110. The skin texture sensor 130 and the pressure sensor 120 are respectively coupled to the controller 150 and stacked with the display panel 110. Coupling may include an electrical connection, a mechanical connection, or the like, and may also include connection methods for transmitting signals such as an optical connection, a magnetic connection, or the like.

For example, the pressure sensor 120 is configured to detect the pressing action on the display side 111 of the display panel 110. The skin texture sensor 130 is configured to detect the skin texture image of the user touching the display side 111 of the display panel 110; and the skin texture image may be a fingerprint image, a palm print image, etc. When the pressure sensor 120 detects the pressing action, the controller 150 awakens the skin texture sensor 130 to cause the skin texture sensor 130 to detect the skin texture image of the user touching the display side 111 of the display panel 110, thereby realizing the under-screen skin texture recognition function. Thus, the display device 100 integrates a display function and the under-screen skin texture recognition function. Moreover, the display device 100 only awakens the skin texture sensor 130 when detecting the pressing action, so the skin texture detector can be in a standby state or an off state when the display device is in a screen-off state, and then the power consumption of the display device can be reduced.

The display panel 110 may be an organic light-emitting diode (OLED) display panel or a quantum dot light-emitting diode (PLED) display panel and may also be a liquid crystal display (LCD) display panel, an e-paper display panel, etc. No limitation will be given here in the embodiment of the present disclosure. The OLED display panel, for example, may be a flexible OLED display panel. The OLED display panel has an autoluminescence characteristic, and the emission of a display pixel unit of the OLED display panel may further be controlled or adjusted as required, thereby providing convenience for the acquisition of the skin texture image (for example, taken as a light source for the acquisition of the skin texture image), and helping improve the integration of an electronic device adopting the display device. Non-limiting description will be given to the following partial examples by taking the OLED display panel as an example.

The skin texture sensor 130 can be configured to acquire the skin texture image of the user such as a fingerprint image or a palm print image, and the acquired skin texture image may be used for fingerprint recognition, palm print recognition and other functions. For example, the skin texture sensor 130 has a certain working area (an active region) and includes a plurality of pixel units arranged in a predetermined array. The skin texture sensor 130 is, for example, coupled to a fingerprint processor 160 (e.g., an integrated circuit chip) through a lead, a flexible circuit board and the like, so as to transmit the acquired fingerprint image to the fingerprint processor 160 in a form of data signals. For example, the skin texture sensor 130 may be various types of fingerprint sensors such as a charge-coupled device (CCD) image sensor, a complementary metal-oxide semiconductor (CMOS) image sensor, or the like. The skin texture sensor 130, for example, may only sense a light of a certain wavelength (e.g., an infrared light, a red light or a green light) and may further sense all the visible light as required. Description will be given to the following specific examples by taking the case that the skin texture sensor 130 is a fingerprint sensor for fingerprint recognition as an example.

As shown in FIGS. 1A and 1B, the display side 111 of the display panel 110 is a side provided with a display region 1111, that is, the display side 111 is a side for displaying an image, and a surface of the display side 111 is a surface of the side for displaying the image. A back side 113 of the display panel 110 is a side opposite to the display side 111, and a surface of the back side 113 is a surface of the side opposite to the display side 111. The display region 1111 of the display panel 110 includes a fingerprint recognition region 1112 which may be partial or entire of the display region 1111, thereby realizing a partial under-screen fingerprint recognition function or a full-screen fingerprint recognition function. For example, the user can place a finger in the fingerprint recognition region 1112 or press the fingerprint recognition region 1112. When a light-emitting unit of the display device emits a light, the light emitted by the light-emitting unit is reflected back through the finger and acquired by the skin texture sensor 130 to form an image, and subsequently the fingerprint image obtained by the skin texture sensor 130 can be used for subsequent fingerprint recognition operation.

As shown in FIGS. 1A, 1C and 1D, there may be multiple layout relationships of relative positions between the pressure sensor 120 and the display panel 110. For example, as shown in FIG. 1A, the pressure sensor 120 may be provided in an interior of the display panel 110, namely an in-cell type; as shown in FIG. 1C, the pressure sensor 120 may further be provided on the surface of the display side 111 of the display panel 110, namely an on-cell type; or as shown in FIG. 1D, the pressure sensor 120 may further be provided on the surface of the back side 113 of the display panel 110. No limitation will be given here in the embodiment of the present disclosure.

In addition, as shown in FIGS. 1A, 1C and 1D, there may also be multiple positional layout relationships between the skin texture sensor 130 and the display panel 110. For example, as shown in FIGS. 1A and 1C, the skin texture sensor 130 may be provided on the back side 113 of the display panel 110; and as shown in FIG. 1D, the skin texture sensor 130 may be provided on a side, away from the display panel 110, of the pressure sensor 120. Or moreover, the skin texture sensor 130 may further be formed in the interior of the display panel to realize the integration with the display panel. No limitation will be given here in the embodiment of the present disclosure.

The implementation of the pressure sensor 120 may further be multiple and will not be limited in the embodiment of the present disclosure. Detailed description will be given in the following specific examples to different structures of the pressure sensor 120 provided at different positions of the display panel 110.

Figure 2A:
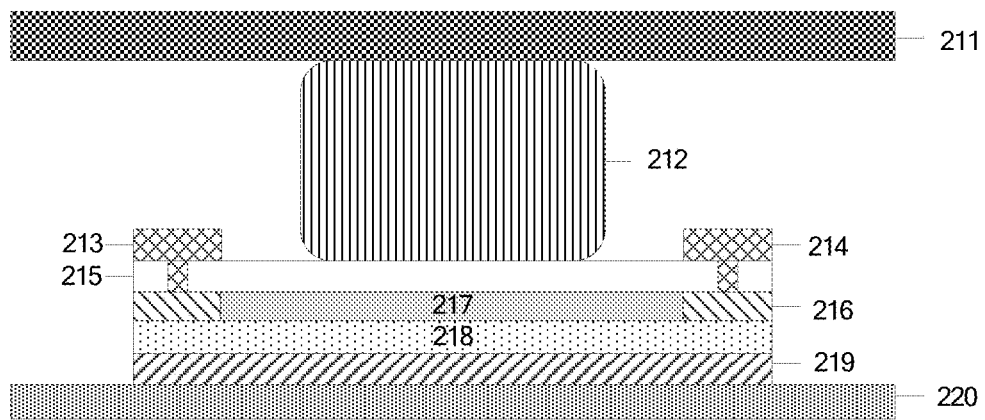
FIG. 2A is a schematic cross-sectional view of a pressure sensor in the display device provided by some embodiments of the present disclosure.
Figure 2B:
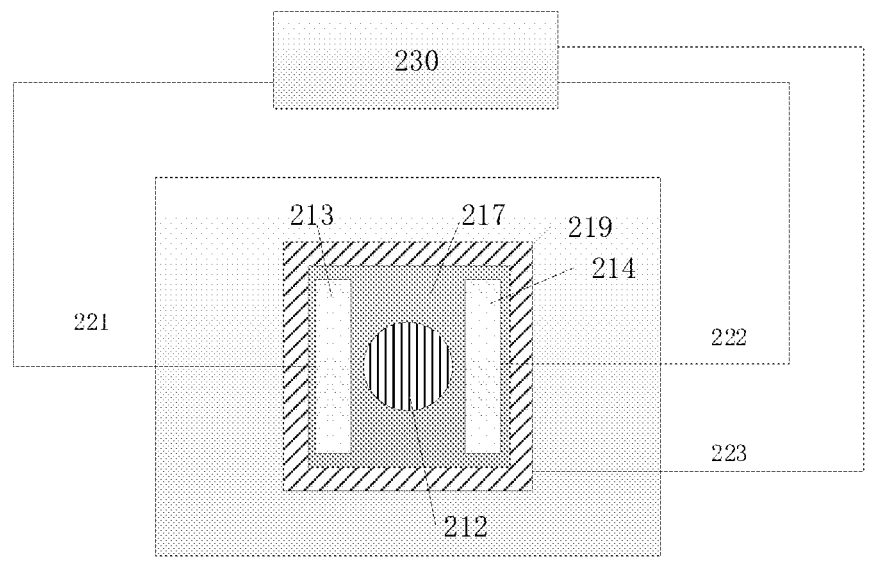
FIG. 2B is a top view of the pressure sensor in the display device provided by some embodiments of the present disclosure.
Figure 2C:
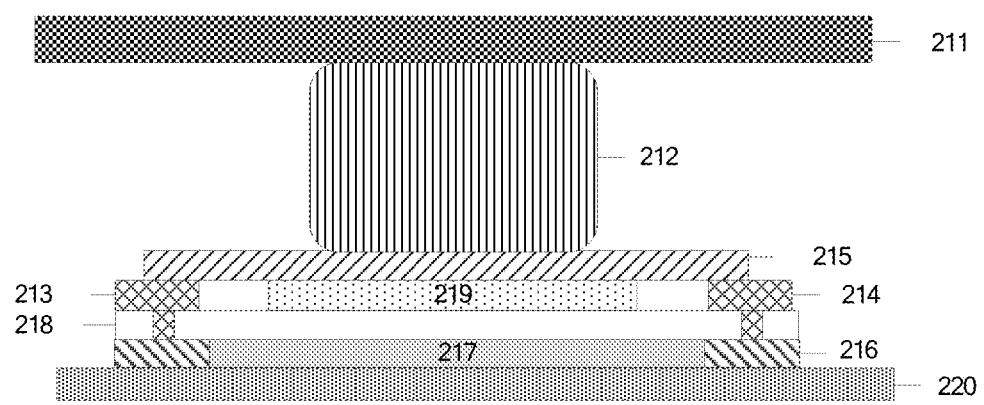
FIG. 2C is a schematic cross-sectional view of a pressure sensor in the display device provided by some embodiments of the present disclosure.
Figure 2D:
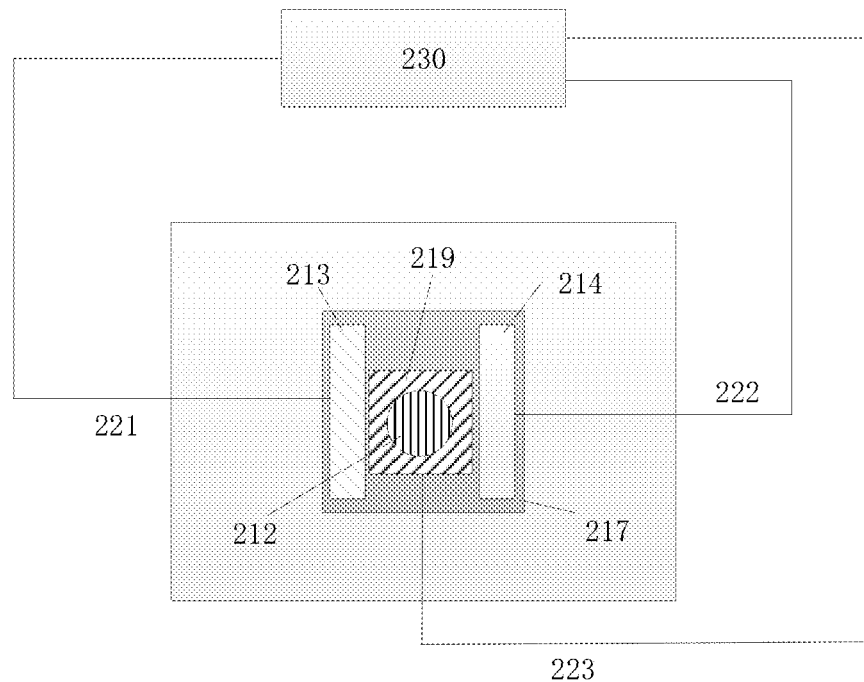
FIG. 2D is a top view of the pressure sensor in the display device provided by some embodiments of the present disclosure.

As shown in FIGS. 2A to 2D, FIG. 2A is a schematic cross-sectional view of a pressure sensor in the display device provided by some embodiments of the present disclosure. FIG. 2B is a top view of the pressure sensor in the display device provided by some embodiments of the present disclosure. FIG. 2C is a schematic cross-sectional view of a pressure sensor in the display device provided by some embodiments of the present disclosure. FIG. 2D is a top view of the pressure sensor in the display device provided by some embodiments of the present disclosure.

As shown in FIG. 2A, the pressure sensor in the embodiment is provided in the interior of the display panel 110 and clamped between an opposing substrate 211 of the display panel 110 and an array substrate 220 of the display panel 110. For example, the display panel is an OLED display panel, pixel units for display operation are formed on the array substrate 220, each of the pixel units includes a light-emitting element (OLED) and a driving circuit for driving the light-emitting element, and the driving circuit includes components such as transistors (e.g., a driving transistor, a data writing transistor, etc.) and capacitors. In addition, gate lines, data lines, power lines and the like are further formed on the array substrate 220 and used for respectively providing scanning signals, data signals, supply voltage and the like for the pixel units. The opposing substrate 221, for example, is a package substrate, a color filter (CF) substrate or the like, is combined with the array substrate 220 through package material such as a sealant, provides protection for the light-emitting element and the like, and has a sealing effect to isolate water vapor, oxygen, etc. Spacers or the like may be formed between the opposing substrate 211 and the array substrate 220 to define a space for placing the sealing material, etc.

The pressure sensor may include a transistor and a pressure transmission portion 212. The pressure transmission portion 212 may be cylindrical, e.g., in a form of a cylinder, a triangular prism, a quadrangular prism, a pentagonal prism, etc. Of course, the shape of the pressure transmission portion 212 is not limited thereto. For example, the pressure transmission portion 212 may be spherical, polyhedral or the like, for example, may be prepared by an organic material, for example, may be simultaneously formed when the above spacers are formed. The transistor may include at least one part of a source electrode 213, a drain electrode 214, a protective layer 215, a semiconductor layer 217, an insulation layer 218 and a gate electrode 219. The transistor is, for example, synchronously formed with a certain transistor in the pixel unit of the array substrate.

A material of the semiconductor layer 217 may be microcrystalline silicon, amorphous silicon, polysilicon, oxide semiconductor, etc., and the oxide semiconductor may be indium gallium tin oxide (IGTO), etc. According to the material adopted by the semiconductor layer, source/drain regions may be doped as required. For example, in a case where the semiconductor layer is formed by polysilicon, a source region contacted with the source electrode and a drain region contacted with the drain electrode may be doped. The transistor and the pressure transmission portion 212 included in the pressure sensor, and the transistor and the spacer in the pixel unit of the array substrate are synchronously formed to simplify the manufacturing process and reduce the production cost.

A region, respectively electrically connected with the source electrode 213 and the drain electrode 214, of the semiconductor layer 217 of the transistor is source/drain region 216 (including a source region and a drain region). A part between the source electrode 213 and the drain electrode 214 is a channel region of the transistor. One end of the pressure transmission portion 212 leans against the opposing substrate, and the other end is overlapped with the channel region and leans against the channel region. When the opposing substrate is pressed, the pressure applied to the opposing substrate is transmitted to the channel region of the transistor through the pressure transmission portion 212 and applied to the channel region of the transistor. In the structure, the display device 100 does not need to additionally arrange an independent pressure sensor, which can save the cost, and save the internal space of the display device.

Moreover, the pressure sensor may further include a resistance measuring circuit 230. The transistor is coupled to the resistance measuring circuit 230. As shown in FIG. 2B, for example, the source electrode 213 of the transistor may be connected to the resistance measuring circuit 230 through a source signal line 221, the drain electrode 214 of the transistor may be connected to the resistance measuring circuit 230 through a drain signal line 222, and the gate electrode 219 of the transistor may be connected to the resistance measuring circuit 230 through a gate signal line 223. The specific structure of the resistance measuring circuit 230 is not limited in the embodiment of the present disclosure. For example, the resistance measuring circuit 230 may include an amplifier circuit, an analog-to-digital conversion circuit, etc., for example, can be implemented as a separate device or integrated with other devices.

In the present structure, an on-state voltage may be applied to the gate electrode 219 through the gate signal line 223, so the source electrode 213 and the drain electrode 214 are turned on. In addition, a constant first voltage, for example, is further applied to the source electrode 213 through the source signal line 221, and a constant second voltage, for example, is applied to the drain electrode 214 through the drain signal line 222. Thus, a current flows between the source electrode 213 and the drain electrode 214, and the resistance measuring circuit 230 can acquire the on-resistance of the transistor by detecting the current. When the pressing action is detected on the display side 111 of the display panel 110, the pressure transmission portion 212 transmits the pressure of the pressing action to the channel region, and the pressure results in a change in the electric resistivity of the semiconductor of the channel region, so the resistance of the channel region can change under the action of the pressure. The resistance measuring circuit 230 measures the variation of the resistance of the channel region of the transistor, is coupled to the controller 150, and then can send a feedback signal to the controller 150. The controller 150 determines whether there is a pressing action according to the received feedback signal, if so, awakens the skin texture sensor 130, and then the skin texture sensor 130 begins to work and detects the fingerprint image of the user touching the display side 111 of the display panel 110 for the subsequent fingerprint recognition operation. Moreover, if fingerprint recognition is successful, the controller 150 controls a system of a mobile phone or a tablet PC adopting the display device to enter a working state, for example, for example, to display an operation interface of an application before the screen-off state, to execute a scheduled operation (such as to pay, to enter a specific application, etc.), or the like. When the system of the display device is unlocked, for example, the controller 150 may control the skin texture sensor 130 to be turned off and allow the sensor to restore a standby state, so as to further reduce the power consumption of the display device 100. If the fingerprint recognition fails, the controller 150, for example, may control the mobile phone or the tablet PC to be kept in the screen-off state.

In the structure as shown in FIG. 2A, the gate electrode 219 is away from the pressure transmission portion 212 compared with the source electrode 213 and the drain electrode 214. In another example, as shown in FIGS. 2C and 2D, the source electrode 213 and the drain electrode 214 are away from the pressure transmission portion 212 compared with the gate electrode 219. No limitation will be given here in the embodiment of the present disclosure. The working principles of the structure as shown in FIGS. 2C and 2D are the same with the working principles of the structure as shown in FIGS. 2A and 2B. Moreover, as shown in FIG. 2D, the source electrode 213 of the transistor may be connected to the resistance measuring circuit 230 through the source signal line 221, the drain electrode 214 of the transistor may be connected to the resistance measuring circuit 230 through the drain signal line 222, and the gate electrode 219 of the transistor may be connected to the resistance measuring circuit 230 through the gate signal line 223. No further description will be given here.

Description will be given below continuously to the embodiments of the pressure sensor 120 provided on the surface of the display side 111 of the display panel 110.

Figure 3A:
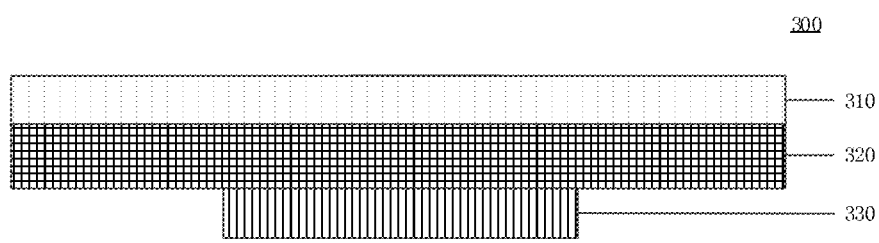
FIG. 3A is a schematic cross-sectional view of another pressure sensor in the display device provided by some embodiments of the present disclosure.
Figure 3B:
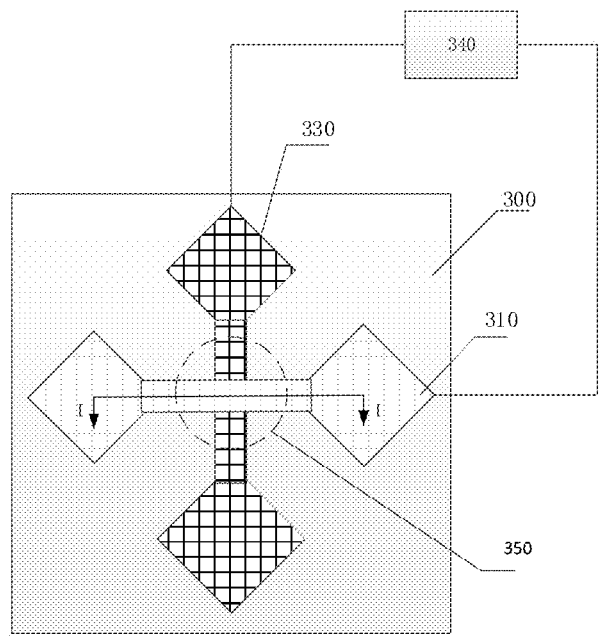
FIG. 3B is a top view of the pressure sensor provided by the embodiment as shown in FIG. 3A.
Figure 3C:
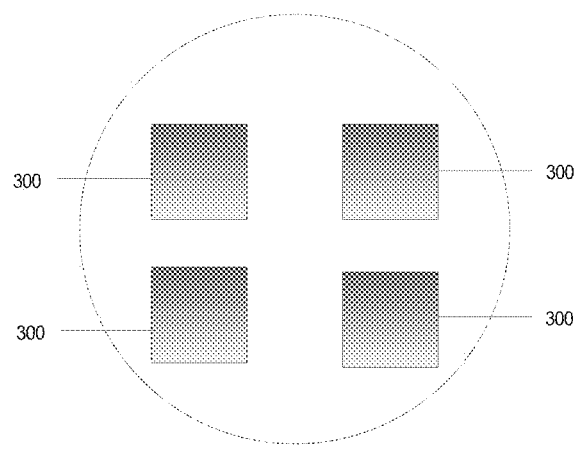
FIG. 3C is a top view of another pressure sensor in the display device provided by some embodiments of the present disclosure.

As shown in FIGS. 3A, 3B and 3C, FIG. 3A is a schematic cross-sectional view of another pressure sensor of the display device provided by the embodiment as shown in FIG. 3B along the section line I-I at an intersection 350 of a first electrode 310 and a second electrode 330, FIG. 3B is a top view of the pressure sensor provided by the embodiment as shown in FIG. 3A, and FIG. 3C is a top view of another pressure sensor of the display device provided by some embodiments of the present disclosure.

As shown in FIG. 3A, the pressure sensor 300 is provided on the surface of the display side of the display panel, for example, including a first electrode 310, a piezoelectric material layer 320 and a second electrode 330, and the first electrode 310, the piezoelectric material layer 320 and the second electrode 330 are sequentially stacked on the surface of the display side of the display panel. The piezoelectric material layer 320 may be a transparent piezoelectric film. For example, the material of the transparent piezoelectric film may be quartz crystal, lead zirconate titanate, polytetrafluoroethylene, etc. In the present structure, the display device does not need to additionally arrange an independent pressure sensor, which can save the cost, and save the internal space of the display device. As shown in FIG. 3B, in an example of the embodiment, the pressure sensor 300 includes a first electrode 310 and a second electrode 330. Both the first electrode 310 and the second electrode 330 are strip electrodes, are extended along different directions, and are intersected with and insulated from each other. The pressure sensor 300 may further include a voltage measuring circuit 340, and the voltage measuring circuit 340 is electrically connected with the first electrode 310 and the second electrode 330. When the display side 111 of the display panel 110 is under the action of the pressing action, the voltage measuring circuit 340 measures the voltage difference, through the first electrode 310 and the second electrode 330, produced between two sides of the piezoelectric material layer 320 when the pressure sensor 300 is under the action of the pressing action. The specific structure of the voltage measuring circuit 340 is not limited in the embodiment of the present disclosure. For example, the voltage measuring circuit 340 may include an amplifier circuit, an analog-to-digital conversion circuit, etc., for example, can be implemented as a separate device or integrated with other devices.

The voltage measuring circuit 340 is coupled to the controller 150, and then can send a feedback signal to the controller 150. The controller 150 determines whether there is a pressing action according to the feedback signal received from the voltage measuring circuit 340, if so, the controller 150 awakens the skin texture sensor 130 to cause the skin texture sensor 130 to work, and to detect a fingerprint image of a user touching the display side of the display panel for the subsequent fingerprint recognition operation. If the fingerprint recognition is successful, the controller 150 controls a system of a mobile phone or a tablet PC adopting the display device to enter a working state, for example, to display an operation interface of an application before the screen-off state, to execute a scheduled operation (such as to pay, to enter a specific application, etc.), or the like. When the system of the display device is unlocked, for example, the controller 150 may control the skin texture sensor 130 to be turned off and allow the sensor to restore a standby state, so as to further reduce the power consumption of the display device 100. If the fingerprint recognition fails, the controller 150, for example, may control the mobile phone or the tablet PC to be kept in the screen-off state.

As shown in FIG. 3C, a plurality of pressure sensors 300 may be independently spaced in a predetermined region (for example, part or the entire of the display region) on the surface of the display side 111 of the display panel 110, and the pressure sensors 300 may be respectively electrically connected with the voltage measuring circuit 340 to realize the detection of the pressing action on the display side 111 of the display panel 110 in the predetermined region. In another example, the position of the pressing action on the surface of the display side of the display panel may be determined by positioning the pressure sensor 300 on which the voltage difference is detected, that is, further realizing a position detection function.

As shown in FIGS. 1A to 1E, in some embodiments of the present disclosure, the display device 100 may further include a live detection sensor 140, and the live detection sensor 140 is coupled to the controller 150 and configured to detect whether an object touching or pressing the surface of the display side of the display device is a human body. If the detection result of the live detection sensor 140 determines that the human body executes the pressing operation, the controller 150 may be controlled to detect a fingerprint image. If the object executing the pressing operation is determined to be not a human body, e.g., is a touch pen or other objects, the controller 150 may not be controlled to detect the fingerprint image. Thus, the power consumption of the display device can be further reduced.

The implementation of the live detection sensor 140 is multiple. For example, the live detection sensor 140 may be a capacitance touch sensor, an infrared sensor, etc. In some embodiments, the live detection sensor 140 may be implemented by multiplexing a touch sensor that detects a position. If the live detection sensor is a capacitance touch sensor, in a case where the pressing action is executed by a human body, the capacitance of the capacitance touch sensor may change, and the measuring circuit detects the capacitance variation and determines that the pressing action is executed by the human body. If the live detection sensor is an infrared sensor, in a case where the pressing action is executed by a human body, the infrared sensor may detect an infrared light emitted (or reflected) by a finger, and then determines that the pressing action is executed by the human body. Of course, the live detection sensor is not limited thereto, and the detecting method thereof is also not limited thereto.

The position layout relationships between the live detection sensor 140 and the display panel may also be multiple. For example, the live detection sensor 140 may be provided on the surface of the display side 111 of the display panel 110, namely an on-cell type. Moreover, for example, the live detection sensor 140 may further be provided in the interior of the display panel 110, namely an in-cell type. Further-more, for example, the live detection sensor 140 may further be provided on the back side 113 of the display panel 110. No limitation will be given here in the embodiment of the present disclosure.

In at least one example, in a case where the live detection sensor 140 is implemented as a capacitance touch sensor, the live detection sensor 140 may be obtained by multiplexing a capacitance touch sensor for realizing positioning. The capacitance touch sensor may be a self-capacitance or a mutual-capacitance type, and no further description will be given here. In a case where the live detection sensor 140 is implemented as an infrared sensor, the live detection sensor 140 may be obtained by multiplexing an infrared touch sensor for realizing positioning, and an infrared light detector (e.g., a photodiode or a phototransistor) may be provided on the back side of the display panel to detect the infrared light emitted (or reflected) by the finger of the user.

In the structure as shown in FIGS. 1A to 1E, the pressure sensor 120 detects the pressing action on the display side 111 of the display panel 110, the live detection sensor 140 detects whether the pressing action on the display side 111 of the display panel 110 is executed by a human body, and the pressure sensor 120 and the live detection sensor 140 provide a detected feedback signal to the controller 150. In a case where the controller 150 determines that the pressure sensor 120 detects the pressing action on the display side 111 of the display panel 110, and determines that the pressing action on the display side 111 of the display panel 110 is executed by the human body, the controller 150 awakens the skin texture sensor 130, and the skin texture sensor 130 detects a fingerprint image of the user touching the display side of the display panel for the subsequent fingerprint recognition operation. Moreover, if fingerprint recognition is successful, the controller 150 controls a system of a mobile phone or a tablet PC adopting the display device to enter a working state, for example, to display an operation interface of an application before the screen-off state, to execute a scheduled operation (such as to pay, to enter a specific application, etc.), or the like. When the system of the display device is unlocked, for example, the controller 150 may control the skin texture sensor 130 to be turned off and allow the sensor to restore a standby state, so as to further reduce the power consumption of the display device 100. If the fingerprint recognition fails, the controller 150, for example, may control the mobile phone or the tablet PC to be kept in the screen-off state.

In a case where the live detection sensor 140 feeds back that the pressing action is not executed by a human body, the controller 150 maintains the skin texture sensor 130 in a standby state or an off state. In this way, in a case where the pressure sensed by the display device is not the pressure applied by a finger, the problems of misoperation and increased power consumption produced by the fact that the under-screen fingerprint unlock function of the display device may still be turned on can be effectively avoided.

As a change example, the skin texture sensor 130 can send the fingerprint image imaged thereon to the controller 150, and the controller 150 sends the fingerprint image of the user to the fingerprint processor 160, so the fingerprint processor 160 can finish the recognition of the texture image of the user. For example, if the texture recognition of the user is successful, the controller 150 releases the system locking state of an electronic device including the display device. If the texture recognition of the user fails or verification of the user fails, the controller 150 controls the display device 100 to be kept in a screen-off state.

In some embodiments of the present disclosure, the fingerprint processor 160 may be implemented by a general-purpose processor or a special-purpose processor. The controller 150 may be various types of integrated circuit chips having a processing function, may have various computational structures, such as a complex instruction set computer (CISC) structure, and a reduced instruction set computing (RISC) structure or a structure that incorporates a plurality of instruction set combinations. In some embodiments, the controller 150 can further be a microprocessor, e.g., an X86 processor or an ARM processor, and can also be a digital signal processor (DSP), etc.

Of course, the structure of the display device 100 provided by some embodiments of the present disclosure is not limited to the exemplary structures as shown in FIGS. 1A-1E. For example, the display device 100 may further include other elements such as a driving chip, a memory, a microphone, a loudspeaker, etc. No further description will be given here to these elements.

In the display device provided by at least some embodiments of the present disclosure, the pressure sensor is adopted to detect the pressing action on the display side of the display panel. When the pressure sensor detects the pressing action, the controller awakens the skin texture sensor, and the skin texture sensor detects the skin texture image of the user touching the display side of the display panel, so as to reduce the power consumption of the under-screen fingerprint detection. Moreover, the display device does not need the additional arrangement of an independent pressure sensor, which can save the cost, and save the internal space of the display device. Moreover, when the system of the display device is unlocked, the circuit of the skin texture sensor is controlled to be turned off, so as to further reduce the power consumption of the display device.

Moreover, in at least some embodiments of the present disclosure, the live detection sensor 140 is adopted to detect whether the pressing action on the display side 111 of the display panel 110 is executed by a human body. In a case where the live detection sensor feeds back that the pressing action is not executed by the human body, the controller maintains the skin texture sensor in a standby state, thereby further avoiding the problem of misoperation produced by the fact that the under-screen fingerprint unlocking function may still be turned on in a case where the pressure sensed by the display device is not the pressure of the finger.

Figure 4:
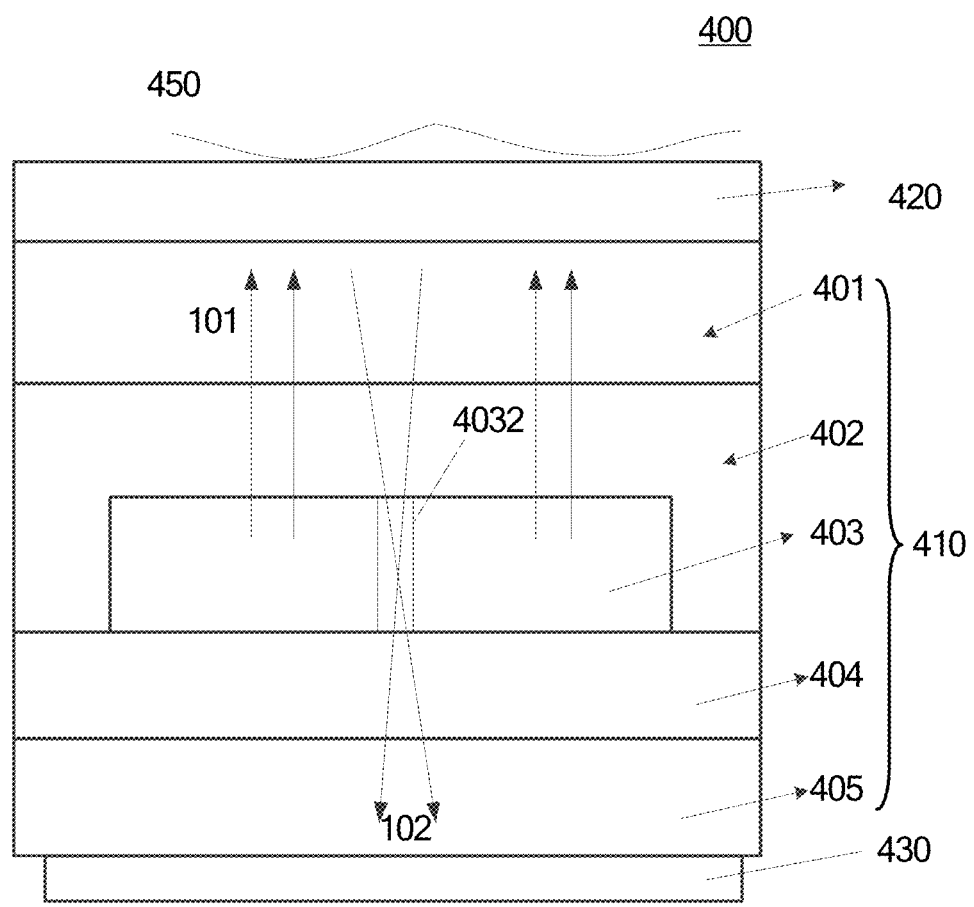
FIG. 4 is a schematic cross-sectional view of a display device provided by some embodiments of the present disclosure.

FIG. 4 is a schematic cross-sectional view of a display device 400 provided by some embodiments of the present disclosure. In the embodiment as shown in FIG. 4, the display device 400 includes a display panel 410, a pressure sensor 420, a skin texture sensor 430 and a controller (not shown in FIG. 4). In the present embodiment, the display panel 410 is an OLED display panel.

As shown in FIG. 4, the OLED display panel 410 includes structures such as a top film 401, a packaging film 402, pixel units 403, a flexible base 404 and a bottom film 405.

The bottom film 405 provides a protective and supporting function for other structures and functional layers disposed thereon, and is, for example, a plastic substrate or a glass substrate with high intensity. The flexible base 404 is used for providing buffer, for example, is a flexible base prepared by materials such as polyimide (PI), polypropylene (PP), polycarbonate (PC), or the like.

The pixel units 403 are formed on the flexible base 404, and include a plurality of pixel units arranged in a predetermined array and signal lines (including gate lines, data lines, detection lines and the like) for providing electrical signals (including scanning signals, data signals, detection signals and the like). Each of the pixel units includes a light-emitting element (e.g., an OLED element) and a pixel driving circuit for driving the light-emitting element (the OLED element) to emit light. The pixel driving circuit is coupled to the signal lines to receive corresponding control signals and driving voltage, and drives the light-emitting element to emit light as required, so as to realize functions such as display, touch or skin texture (e.g., fingerprint) recognition. The light 101 emitted by the pixel units can be used for display and taken as an incident light of under-screen fingerprint detection. More specifically, the light 101 emitted by the light-emitting element in the pixel unit during work is reflected by the skin (finger or palm) 450 of the user on the display side of the display panel and is used for recognizing the skin texture image of the user.

The packaging film 402 covers the pixel units 403 to prevent external water vapor from entering the pixel units 403 and causing aging or deterioration. The packaging film 402 may be a multi-layer packaging film, for example, including an inorganic insulation layer and an organic insulation layer which are superimposed to each other.

The top film 401 may be a cover plate, for example, a substrate or a thick film prepared by glass or plastics, and is used for providing support and protection, for example, for a user to perform operations such as touch, pressing, or the like.

The OLED display panel 410 may further include other structures or functional layers as required. For example, the OLED display panel 410 may include a touch structure so as to be used for realizing a touch function. The touch structure, for example, may be provided in the pixel unit 403 or formed on the top film, for example, may be a capacitance type and a resistance type. The touch structure may be multiplexed as the live detection sensor.

In order to realize the under-screen fingerprint detection function, the top film 401, the packaging film 402, the flexible base 404 and the bottom film 405 are at least partially transparent, and apertures 4032 are formed between the pixel unit 403 and an adjacent pixel unit, so the light reflected from the fingerprint on the surface of the top film 401 can be incident into the skin texture sensor 430, and the fingerprint image is acquired by aperture imaging. For example, the OLED display panel 410 may further include a microlens array (not shown in the FIG. 4). The microlens array is formed, for example, corresponding to the apertures 4032, light 102 running through the apertures 4032 is collimated or light 102 obtained after running through the apertures 4032 is collimated according to the forming position of the microlens array, and the collimated light 102 is incident into the skin texture sensor 430.

In the display device provided by at least one embodiment of the present disclosure, the pressure sensor 420 is adopted to detect the pressing action on the display side of the display panel 410. When it is determined that the pressure sensor 420 detects the pressing action, the controller awakens the skin texture sensor, and the skin texture sensor 430 detects the fingerprint image of the user touching the display side of the display panel 410. The fingerprint image is provided to the fingerprint processor. Thus, the power consumption of under-screen fingerprint detection is reduced.

For example, the display device, for example, may be any product or component with display function such as a mobile phone, a tablet PC, a TV, a display, a notebook computer, a digital photo frame or a navigator.

Some other embodiments of the present disclosure provide an operation method of the display device described above. The operation method and the working principle of the display device provided by at least one embodiment of the present disclosure will be exemplarily described below with reference to FIG. 5.

Figure 5:
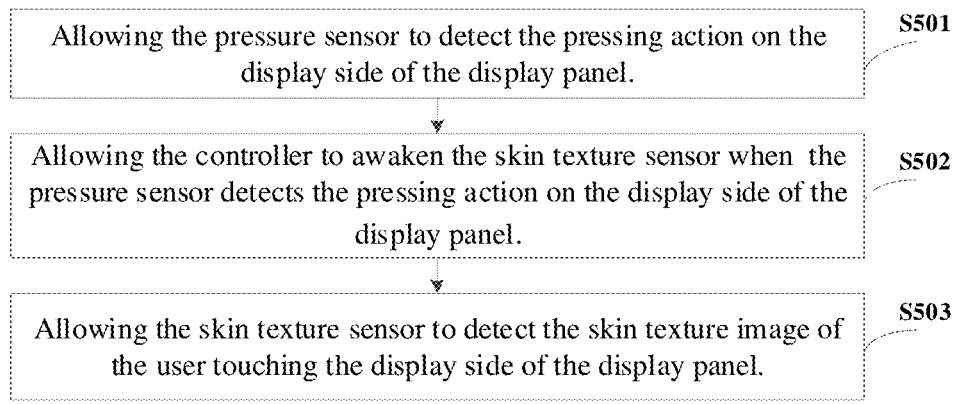
FIG. 5 is a flowchart of an operation method of the display device provided by some embodiments of the present disclosure.

As shown in FIG. 5, the operation method of the display device provided by some embodiments of the present disclosure includes the following steps S501 to S503.

Step S501: allowing the pressure sensor to detect the pressing action on the display side of the display panel.

Step S502: allowing the controller to awaken the skin texture sensor when the pressure sensor detects the pressing action on the display side of the display panel.

S503: allowing the skin texture sensor to detect the skin texture image of the user touching the display side of the display panel.

In the operation method of the display device provided by at least one embodiment of the present disclosure, the pressure sensor is adopted to detect the pressing action on the display side of the display panel. When determining that the pressure sensor detects the pressing action on the display side of the display panel, the controller awakens the skin texture sensor, and the skin texture sensor detects the skin texture image of the user touching the display side of the display panel. Thus, the power consumption of the under-screen fingerprint detection is reduced.

Figure 6:
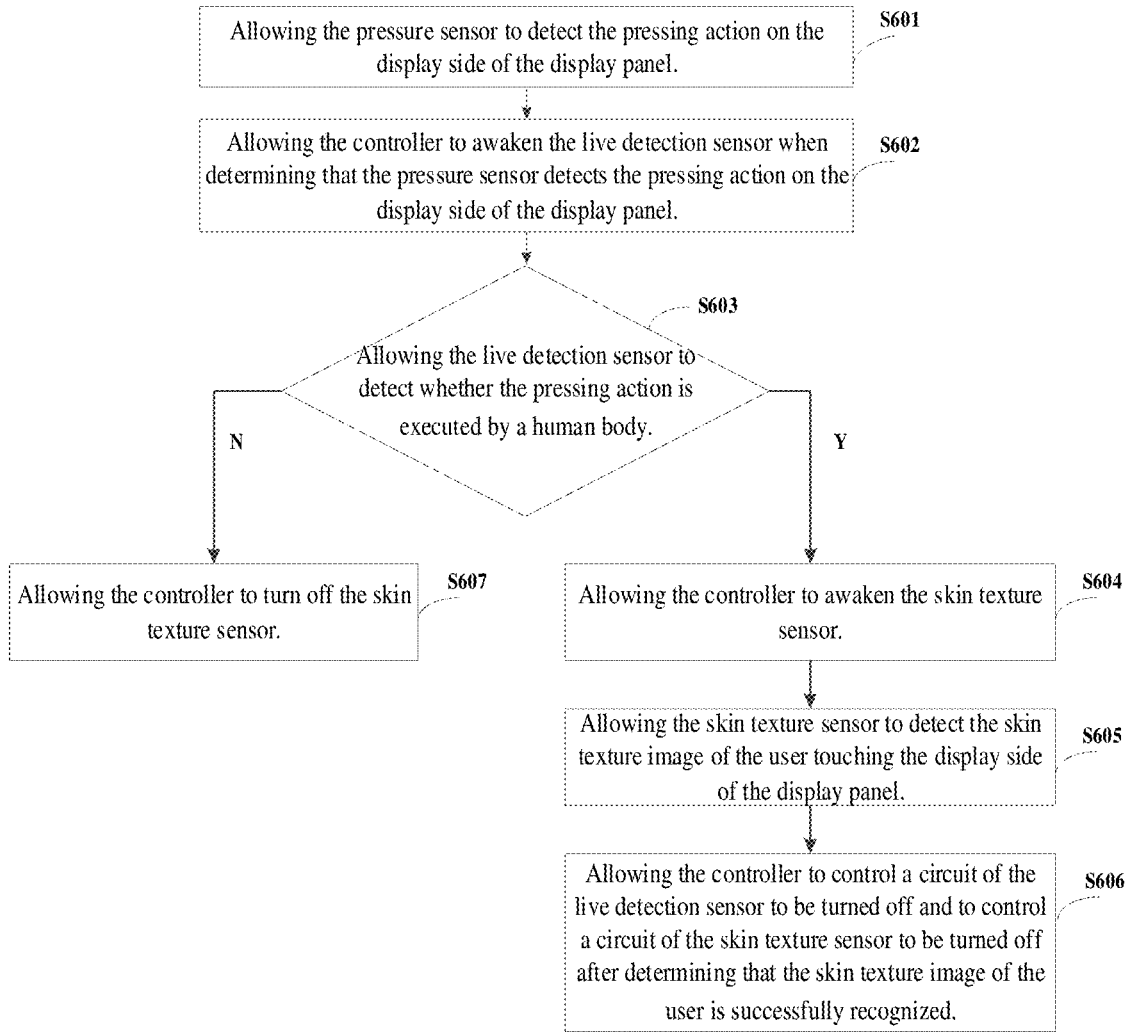
FIG. 6 is a flowchart of another operation method of the display device provided by some embodiments of the present disclosure.

FIG. 6 is a flowchart of another operation method of the display device provided by some embodiments of the present disclosure. The display device may further include a live detection sensor. The method includes the following steps S601 to S607.

Step S601: allowing the pressure sensor to detect the pressing action on the display side of the display panel.

After the step S601, if the live detection sensor is in a working state, the following step S603 may be directly executed; and if the live detection sensor is in a standby state or an off state, the following step S602 may be executed.

Step S602: allowing the controller to awaken the live detection sensor when determining that the pressure sensor detects the pressing action on the display side of the display panel.

Step S603: allowing the live detection sensor to detect whether the pressing action is executed by a human body.

There are many methods for detecting whether the pressing action is executed by the human body. For example, if the live detection sensor is a capacitance touch sensor, in a case where the pressing action is executed by the human body, the capacitance of the capacitance touch sensor may change, and the capacitance variation may be detected by a measuring circuit, so as to determine that the pressing action is executed by the human body. Moreover, for example, if the live detection sensor is an infrared sensor, in a case where the pressing action is executed by the human body, the infrared sensor may detect an infrared light emitted by a finger, so as to determine that the pressing action is executed by the human body. Of course, the live detection sensor is not limited thereto, and the detection method thereof is also not limited thereto.

When determining that the live detection sensor feeds back that the pressing action is executed by the human body, the steps S604 to S606 are executed; and when determining that the live detection sensor feeds back that the pressing action is not executed by the human body, the step S607 is executed.

Step S604: allowing the controller to awaken the skin texture sensor.

When determining that the pressure sensor detects the pressing action on the display side of the display panel and determining that the live detection sensor feeds back that the pressing action is executed by the human body, the controller awakens the skin texture sensor, and the skin texture sensor detects the skin texture image of the user touching the display side of the display panel, thereby reducing the power consumption of the under-screen fingerprint detection, and avoiding the problem of misoperation caused by the fact that the under-screen fingerprint unlocking function of the display device may still be turned on in a case where the pressure sensed by the display device is not the pressure of the finger.

Step S605: allowing the skin texture sensor to detect the skin texture image of the user touching the display side of the display panel.

The skin texture image of the user touching the display side of the display panel detected by the skin texture sensor is used for subsequent fingerprint recognition operation. If the fingerprint recognition is successful, the controller controls a system of a mobile phone or a tablet PC including the display device to enter a working state, for example, to display an operation interface of an application before being in the screen-off state, or to execute a predetermined operation. If the fingerprint recognition fails, the controller may control the mobile phone or the tablet PC to be kept in the screen-off state.

Step S606: allowing the controller to control a circuit of the live detection sensor to be turned off and to control a circuit of the skin texture sensor to be turned off after determining that the skin texture image of the user is successfully recognized.

The power consumption of the display device can be further reduced by allowing the controller to control the circuit of the live detection sensor to be turned off and to control the circuit of the skin texture sensor to be turned off.

Step S607: allowing the controller to turn off the skin texture sensor.

When determining that the live detection sensor feeds back that the pressing action is not executed by the human body, the controller turns off the skin texture sensor to cause the skin texture sensor to be in a standby state or an off state, thereby avoiding the problem of misoperation caused by the fact that the under-screen fingerprint unlocking function of the display device may still be turned on in a case where the pressure sensed by the display device is not the pressure of the finger.

In the operation method of the display device provided by at least one embodiment of the present disclosure, the pressure sensor is adopted to detect the pressing action on the display side of the display panel. When determining that the pressure sensor detects the pressing action on the display side of the display panel, the controller awakens the skin texture sensor, and the skin texture sensor detects the skin texture image of the user touching the display side of the display panel. Thus, the power consumption of under-screen fingerprint detection is reduced. Moreover, when determining that the live detection sensor feeds back that the pressing action is executed by the human body, the controller awakens the skin texture sensor, or else, the controller turns off the skin texture sensor. This method can avoid the problem of misoperation caused by the fact that the under-screen fingerprint unlocking function of the display device may still be turned on when the pressure sensed by the display device is not the pressure of the finger.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display device, comprising a display panel, a pressure sensor, a skin texture sensor, a live detection sensor, and a controller,
    wherein the skin texture sensor, the pressure sensor, and the live detection sensor are respectively coupled to the controller;
    the pressure sensor is configured to detect a pressing action on a display side of the display panel;
    the live detection sensor is configured to detect whether the pressing action is executed by a human body;
    the controller is configured to awaken the skin texture sensor when the pressure sensor detects the pressing action, and the controller is further configured to awaken the skin texture sensor in a case where the live detection sensor feeds back that the pressing action is executed by the human body, or else, the controller is configured to turn off the skin texture sensor; and
    the skin texture sensor is configured to detect a skin texture image of a user touching the display side of the display panel.

2. The display device according to claim 1, wherein the live detection sensor is a capacitance touch sensor or an infrared sensor.

3. The display device according to claim 2, wherein the pressure sensor is provided at at least one position selected from the group consisting of: a surface of the display side of the display panel, an interior of the display panel, and a surface of a back side, opposite to the display side, of the display panel.

4. The display device according to claim 3, wherein the pressure sensor is provided at the interior of the display panel, and the pressure sensor comprises a transistor and a pressure transmission portion;
    the transistor comprises a channel region; the pressure transmission portion is overlapped with the channel region and configured to transmit a pressure of the pressing action to the channel region; and a resistance of the channel region is variable under action of the pressure.

5. The display device according to claim 4, wherein the pressure sensor further comprises a resistance measuring circuit; the transistor is coupled to the resistance measuring circuit; and
    the resistance measuring circuit is configured to measure a variation of the resistance of the channel region of the transistor and send a feedback signal to the controller.

6. The display device according to claim 4, wherein the transistor comprises a gate electrode, a source electrode and a drain electrode;
    the gate electrode is closer to the pressure transmission portion compared with the source electrode and the drain electrode, or the source electrode and the drain electrode are closer to the pressure transmission portion compared with the gate electrode.

7. The display device according to claim 4, wherein the pressure transmission portion is cylindrical.

8. The display device according to claim 4, wherein the display panel comprises an array substrate and an opposing substrate;

the transistor is formed on the array substrate; and the pressure transmission portion is clamped between the opposing substrate and the transistor.

9. The display device according to claim 4, wherein the controller is further configured to control a circuit of the live detection sensor to be turned off and to control a circuit of the skin texture sensor to be turned off after the skin texture image of the user is successfully recognized.

10. The display device according to claim 3, wherein the pressure sensor is on the surface of the display side of the display panel, the pressure sensor comprises a first electrode, a piezoelectric material layer and a second electrode, and the first electrode, the piezoelectric material layer and the second electrode are sequentially stacked on the surface of the display side of the display panel.

11. The display device according to claim 10, wherein the pressure sensor further comprises a voltage measuring circuit, the voltage measuring circuit is configured to be electrically connected with the first electrode and the second electrode, and the voltage measuring circuit is configured to measure a voltage difference produced between two sides of the piezoelectric material layer when the pressure sensor is under action of the pressing action, and send a feedback signal to the controller.

12. The display device according to claim 11, wherein the piezoelectric material layer is a transparent piezoelectric film.

13. The display device according to claim 10, wherein the controller is further configured to control a circuit of the live detection sensor to be turned off and to control a circuit of the skin texture sensor to be turned off after the skin texture image of the user is successfully recognized.

14. The display device according to claim 13, wherein the controller is further configured to control a circuit of the live detection sensor to be turned off and to control a circuit of the skin texture sensor to be turned off after the skin texture image of the user is successfully recognized.

15. The display device according to claim 1, wherein the display panel comprises a pixel unit; the pixel unit comprises a light-emitting element; and a light emitted by the light-emitting element during work is reflected by a skin, on the display side of the display panel, of the user, and is used for recognizing the skin texture image of the user.

16. The display device according to claim 1, wherein the display panel is an organic light-emitting diode display panel or a quantum dot light-emitting diode display panel.

17. An operation method of a display device, wherein the display device comprises a display panel, a pressure sensor, a skin texture sensor, a live detection sensor, and a controller, the skin texture sensor, the pressure sensor, and the live detection sensor are respectively coupled to the controller, wherein the method comprises:

allowing the pressure sensor to detect a pressing action on a display side of the display panel;

allowing the live detection sensor to detect whether the pressing action is executed by a human body;

allowing the controller to awaken the skin texture sensor when the pressure sensor detects the pressing action on the display side of the display panel, and further allowing the controller to awaken the skin texture sensor in a case where the live detection sensor feeds back that the pressing action is executed by the human body, or else, the controller is allowed to turn off the skin texture sensor; and allowing the skin texture sensor to detect a skin texture image of a user touching the display side of the display panel.

18. The method according to claim 17, further comprising: after the skin texture image of the user is successfully recognized, allowing the controller to control a circuit of the live detection sensor to be turned off and to control a circuit of the skin texture sensor to be turned off.

* * * * *

UNITED STATES PATENT AND TRADEMARK OFFICE
CERTIFICATE OF CORRECTION

PATENT NO. : 11,126,816 B2
APPLICATION NO. : 16/642068
DATED : September 21, 2021
INVENTOR(S) : Jianbo Fu et al.

It is certified that error appears in the above-identified patent and that said Letters Patent is hereby corrected as shown below:

In the Claims

Column 16, Line 11-Column 18, Lines 1-38, should read:
1. A display device, comprising a display panel, a pressure sensor, a skin texture sensor, a live detection sensor, and a controller,
    wherein the skin texture sensor, the pressure sensor, and the live detection sensor are respectively coupled to the controller;
    the pressure sensor is configured to detect a pressing action on a display side of the display panel;
    the live detection sensor is configured to detect whether the pressing action is executed by a human body;
    the controller is configured to awaken the skin texture sensor when the pressure sensor detects the pressing action, wherein the controller is configured to awaken the skin texture sensor in a case where the live detection sensor feeds back that the pressing action is executed by the human body, or else, the controller is configured to turn off the skin texture sensor; and
    the skin texture sensor is configured to detect a skin texture image of a user touching the display side of the display panel.

2. The display device according to claim 1, wherein the live detection sensor is a capacitance touch sensor or an infrared sensor.

3. The display device according to claim 2, wherein the pressure sensor is provided at least one position selected from the group consisting of: a surface of the display side of the display panel, an interior of the display panel, and a surface of a back side, opposite to the display side, of the display panel.

4. The display device according to claim 3, wherein the pressure sensor is provided at the interior of the display panel, and the pressure sensor comprises a transistor and a pressure transmission portion;

Signed and Sealed this
Twenty-fourth Day of May, 2022

Katherine Kelly Vidal
*Director of the United States Patent and Trademark Office* the transistor comprises a channel region; the pressure transmission portion is overlapped with the channel region and configured to transmit a pressure of the pressing action to the channel region; and a resistance of the channel region is variable under action of the pressure.

5. The display device according to claim 4, wherein the pressure sensor further comprises a resistance measuring circuit; the transistor is coupled to the resistance measuring circuit; and
   the resistance measuring circuit is configured to measure a variation of the resistance of the channel region of the transistor and send a feedback signal to the controller.

6. The display device according to claim 4, wherein the transistor comprises a gate electrode, a source electrode and a drain electrode;
   the gate electrode is closer to the pressure transmission portion compared with the source electrode and the drain electrode, or the source electrode and the drain electrode are closer to the pressure transmission portion compared with the gate electrode.

7. The display device according to claim 4, wherein the pressure transmission portion is cylindrical.

8. The display device according to claim 3, wherein the pressure sensor is on the surface of the display side of the display panel, the pressure sensor comprises a first electrode, a piezoelectric material layer and a second electrode, and the first electrode, the piezoelectric material layer and the second electrode are sequentially stacked on the surface of the display side of the display panel.

9. The display device according to claim 8, wherein the pressure sensor further comprises a voltage measuring circuit, the voltage measuring circuit is configured to be electrically connected with the first electrode and the second electrode, and the voltage measuring circuit is configured to measure a voltage difference produced between two sides of the piezoelectric material layer when the pressure sensor is under action of the pressing action, and send a feedback signal to the controller.

10. The display device according to claim 9, wherein the piezoelectric material layer is a transparent piezoelectric film.

11. The display device according to claim 1, wherein the controller is further configured to control a circuit of the live detection sensor to be turned off and to control a circuit of the skin texture sensor to be turned off after the skin texture image of the user is successfully recognized.

12. The display device according to claim 1, wherein the display panel comprises a pixel unit; the pixel unit comprises a light-emitting element; and
    a light emitted by the light-emitting element during work is reflected by a skin, on the display side of the display panel, of the user, and is used for recognizing the skin texture image of the user.

13. The display device according to claim 1, wherein the display panel is an organic light-emitting diode display panel or a quantum dot light-emitting diode display panel.

14. The display device according to claim 4, wherein the display panel comprises an array substrate and an opposing substrate;

the transistor is formed on the array substrate; and the pressure transmission portion is clamped between the opposing substrate and the transistor.

15. The display device according to claim 4, wherein the controller is further configured to control a circuit of the live detection sensor to be turned off and to control a circuit of the skin texture sensor to be turned off after the skin texture image of the user is successfully recognized.

16. The display device according to claim 8, wherein the controller is further configured to control a circuit of the live detection sensor to be turned off and to control a circuit of the skin texture sensor to be turned off after the skin texture image of the user is successfully recognized.

17. An operation method of a display device, wherein the display device comprises a display panel, a pressure sensor, a skin texture sensor, a live detection sensor, and a controller, the skin texture sensor, the pressure sensor, and the live detection sensor are respectively coupled to the controller,
    wherein the method comprises:
    allowing the pressure sensor to detect a pressing action on a display side of the display panel;
    allowing the live detection sensor to detect whether the pressing action is executed by a human body;
    allowing the controller to awaken the skin texture sensor when the pressure sensor detects the pressing action on the display side of the display panel, wherein the controller is allowed to awaken the skin texture sensor in a case where the live detection sensor feeds back that the pressing action is executed by the human body, or else, the controller is allowed to turn off the skin texture sensor; and
    allowing the skin texture sensor to detect a skin texture image of a user touching the display side of the display panel.

18. The method according to claim 17, further comprising:
    after the skin texture image of the user is successfully recognized, allowing the controller to control a circuit of the live detection sensor to be turned off and to control a circuit of the skin texture sensor to be turned off.